(12) United States Patent
Krivokapic et al.

(10) Patent No.: US 6,512,273 B1
(45) Date of Patent: Jan. 28, 2003

(54) METHOD AND STRUCTURE FOR IMPROVING HOT CARRIER IMMUNITY FOR DEVICES WITH VERY SHALLOW JUNCTIONS

(75) Inventors: Zoran Krivokapic, Santa Clara, CA (US); Ognjen Milic, San Jose, CA (US); Sunny Cherian, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/493,440

(22) Filed: Jan. 28, 2000

(51) Int. Cl.[7] .................. H01L 29/94; H01L 31/113; H01L 31/119
(52) U.S. Cl. .................. 257/369; 257/371; 438/199
(58) Field of Search ................. 257/369, 373, 257/372, 371, 370, 374, 344, 408, 900, 368; 438/199, 223, 224, 227, 228

(56) References Cited

U.S. PATENT DOCUMENTS

| | | | | |
|---|---|---|---|---|
| 5,358,879 A | * | 10/1994 | Brady et al. | 437/44 |
| 5,804,858 A | * | 9/1998 | Hsu et al. | 257/347 |
| 6,028,339 A | * | 2/2000 | Frenette et al. | 257/364 |
| 6,064,096 A | * | 5/2000 | Son | 257/368 |
| 6,191,462 B1 | * | 2/2001 | Chen-Hua | 257/408 |
| 6,246,094 B1 | * | 6/2001 | Wong et al. | 257/397 |
| 6,281,062 B1 | * | 8/2001 | Sanchez | 438/217 |
| 6,291,355 B1 | * | 9/2001 | Liu et al. | 438/706 |

OTHER PUBLICATIONS

Stanley Wolf Ph.D. Silicon Processing for the VLSI Era vol. 3—the Submicron MOSFET, Lttice Press, 1995, pp 183–187.*

* cited by examiner

*Primary Examiner*—Tom Thomas
*Assistant Examiner*—Douglas W. Owens
(74) *Attorney, Agent, or Firm*—Gerald Fisher; Deborah Wenocur

(57) ABSTRACT

An integrated circuit CMOS structure and method for forming the structure provides gate sidewall spacers which are independently optimized for the n-channel and p-channel devices to improve hot-carrier lifetime while maintaining high drive currents. This is accomplished by providing polysilicon spacers for the n-channel devices and silicon nitride spacers for the p-channel devices.

10 Claims, 5 Drawing Sheets

METHOD AND STRUCTURE FOR IMPROVING HOT CARRIER IMMUNITY FOR DEVICES WITH VERY SHALLOW JUNCTIONS

FIELD OF THE INVENTION

This invention relates to an integrated circuit manufacturing process and structure, and in particular a method and structure for improving hot carrier injection lifetimes for devices having very shallow junction depths.

BACKGROUND OF THE INVENTION

Hot carrier effects are an important source of device degradation in MOSFET's. They are caused by high electric fields which usually occur near curved regions of the device junctions, and they increase as gate oxide thickness decreases or as junction depth decreases. Hot carriers can cause several deleterious effects in the device. First, electrons which acquire greater than 1.5 eV of energy can lose the energy via impact ionization which generates electron-hole pairs. In the extreme, this electron-hole pair generation can lead to avalanche breakdown. Second, the hot carriers can overcome the potential energy barrier between the silicon of the substrate and the $SiO_2$ of the gate oxide, thereby causing hot carriers to become injected into the gate oxide. If electron-hole pairs are created, the electrons add to the drain current, whereas the holes contribute to the parasitic substrate current, $I_{sub}$. Hot carriers which pass through the gate oxide into the gate electrode produce a gate current, whereas those which remain trapped in the gate oxide affect the device threshold voltage. Furthermore, the trapped charge accumulates with time.

Device design methods such as double-diffused drains and lightly-doped drains (LDD), also known as extension implants, have been employed to reduce hot-carrier degradation. In the LDD structure, the drain is formed by two implants. A first source/drain implant known as the LDD or extension implant having a relatively light dopant dose extends under the gate electrode. It may be formed by using the gate as an implant mask. A second implant known as the S/D implant having a relatively heavy dopant dose is generally implanted further removed from the gate, and may be formed using the gate with sidewall spacers thereon as an implant mask. The use of the LDD structure allows the maximum electric field in the channel region to be lowered by sharing the voltage drop between the channel and drain regions. This can reduce hot-carrier currents by orders of magnitude. Lowering the dopant dose in the LDD regions is critical as device dimensions, particularly gate length and junction depths, decrease. This is because the smaller dimensions, including smaller radius of curvature for junction and LDD edge regions, can still produce a very high electric field near the gate edge and result in hot carrier injection problems. Current processes can yield electric fields greater than $1.5 \times 10^7$ V cm$^{-1}$, whereas in order to obtain acceptable hot carrier lifetime, fields should not exceed approximately $6 \times 10^6$ V cm$^{-1}$.

The use of tilted channel implants (TCI) is another source of hot carrier generation, which has become important as gate dimensions have decreased. TCI was developed as a method of providing control over the amount of charge under the gate, and therefore reducing short channel effects and improving threshold voltage stability. A description of angled implants to stabilize threshold voltage without blanket channel implant (i.e., TCI) is given in U.S. Pat. No. 5,874,329 by Neary et al, which is hereby incorporated by reference. TCI, which has a characteristic double-elliptical shape extending into the channel region from the edges of the gate and overlapping beneath the center of the gate, replaces the conventional blanket channel implant, which was done prior to gate formation. A typical peak channel dopant concentration using TCI is $1.5-3 \times 10^{18}$ cm$^{-3}$ compared with $1 \times 10^{18}$ cm$^{-3}$ for blanket channel implants. This higher value is necessary for TCI due to its sharper drop of dopant concentration with depth as compared to a uniformly doped channel. The higher peak dopant concentration that occurs near the Si/SiO$_2$ interface contributes to the generation of hot carriers.

Disposable gate sidewall spacer technology has been developed in the prior art. One reason therefor was to enable the use of a high-temperature anneal for S/D and gate doped regions. Prior to the use of disposable spacers, the LDD regions were formed, then spacers were deposited and etched, followed by S/D and gate doping, wherein the S/D region was defined by the spacers. As a result, the LDD regions were subjected to the S/D anneal, which limited the maximum time and temperature of the S/D anneal. The ideal anneal profiles for LDD and S/D are: 1) a short, high-temperature anneal "spike" in a Rapid Thermal Anneal (RTA) machine for the LDD implant in order to ensure very shallow junctions of the extensions; and 2) a longer, higher-temperature anneal for the S/D implant. The high temperature S/D anneal acts: a) to drive dopants deeper in the source/drain region so as to reduce junction capacitance, and b) to drive dopants through the polysilicon gate to the polysilicon/dielectric interface so as to prevent poly depletion effects due to the altered workfunction. Use of disposable spacers allows both of the above ideal anneal profiles to be employed. A disposable spacer is formed to act as a S/D mask, then S/D is implanted, followed by the high-temperature S/D anneal. The disposable spacer is then removed and the LDD region is implanted, followed by the rapid spike LDD anneal.

Another use of disposable spacers is to allow a TCI to be performed subsequent to S/D implant and anneal. The S/D implant and anneal can be performed first while gate sidewall spacers are in place. The sidewall spacers are then removed, and TCI and LDD implants are performed. Any anneals following TCI and LDD implantation employ the lowest usable temperature for the shortest usable time. In this way, particularly for n-channel devices where the boron TCI has high diffusivity, the lateral diffusion of the TCI during S/D anneal can be avoided and lateral diffusion of the TCI during subsequent anneals can be minimized, thus providing improved control of channel implant profile and Vt. Accordingly, the channel dopant can be placed with great accuracy. The TCI dose can also be lowered compared with TCI performed before S/D implant and anneal. If TCI is implanted prior to S/D implant and anneal, there is a loss of channel implant concentration due to thermal out-diffusion and/or transient enhanced diffusion caused by damage during the heavy dose S/D implant. However, if TCI is implanted subsequent to S/D implant and anneal, such channel implant concentration loss is comparatively very small, so the TCI dose can be lowered. Consequently, the TCI concentration near the gate edge is lower, thus lowering the electric field which generates hot carriers.

In order to provide masking and alignment for the subsequent silicide formation when using disposable spacers (which was provided by the S/D masking spacers in single-spacer technology), a second set of gate sidewall spacers is then formed after LDD anneal. These second spacers remain in place and may provide other benefits in addition to their use as silicide masks, as will be described hereinafter.

When the second, permanent spacers are formed from a material which has a dielectric constant higher than that of the gate insulator, the drive current performance of the MOSFET's is improved by the high gate-fringing field, which allows the potential of the gate electrode to be applied to the region in the substrate under the sidewalls, thereby promoting inversion in that region. This is particularly important in MOSFET structures having offset gate structures where the S/D region is offset from, i.e., barely overlapping, the gate. This offset alleviates short channel effects, prevents punch-through, and significantly lowers the parasitic Miller capacitance. MOSFET structures have been proposed using silicon nitride spacers, as described by Kumagai et al in U.S. Pat. No. 5,302,845, and using non-doped polysilicon spacers as described by Shimizu et al in 1992 *Symposium on VLSI Technology Digest of Technical Papers, IEEE*, pp 90–91.

Each of these proposed structures has drawbacks when used in CMOS technology. Polysilicon spacers as described by Shimizu are the preferred spacers for the n-channel devices, because they allow lower dose n-channel LDD extension implant (approximately half the dose as compared to the dose required for oxide spacers) and thereby improve hot carrier injection lifetimes due to lowered electric fields. The higher dielectric constant of polysilicon as compared with silicon nitride enhances the gate fringing effect which permits lower LDD dose. However, use of polysilicon spacers with p-channel devices is not optimal. Poly spacers cause the p-channel devices to lose drive current due to the diffusion of boron, the p-channel S/D dopant, into the polysilicon which increases source/drain resistance.

Silicon nitride spacers as described by Kumagai are preferable to polysilicon spacers for the p-channel devices since boron has a relatively low diffusivity into nitride and a relatively high diffusivity into polysilicon, in contrast to arsenic. Nitride spacers for p-channel devices thereby allow for higher $I_{on}$ than do polysilicon spacers. However, silicon nitride spacers cannot be effectively used for both n-channel and p-channel devices, since the n-channel devices lose drive current due to high diffusivity of arsenic dopants into the nitride.

SUMMARY OF THE INVENTION

It is therefore an object of this invention to provide a structure and a method of forming a structure for achieving improved drive capability for PMOS devices in a CMOS structure while maintaining performance of NMOS devices and improving hot carrier injection lifetimes, using disposable spacer technology.

It is a further object of this invention to provide a structure and a method of forming a structure for achieving improved drive capability for PMOS devices in a CMOS structure while maintaining performance of NMOS devices and improving hot carrier injection lifetimes, using disposable spacer technology, wherein polysilicon permanent spacers are utilized for the n-channel devices and wherein silicon nitride permanent spacers are utilized for the p-channel devices.

DETAILED DESCRIPTION OF THE INVENTION

According to our invention, a method and structure are provided for CMOS technology whereby p-channel devices have double layer gate sidewall spacers comprising silicon nitride/polysilicon, and whereby n-channel devices have single layer gate sidewall spacers comprising polysilicon. In addition, our method includes using disposable spacers for the n-channel devices in order to allow the boron TCI to be performed after S/D implant and anneal. By utilizing our inventive structure, p-channel devices in a CMOS structure are provided with the favorable gate fringing field resulting from the nitride spacer, which allows the use of an offset gate and results in an expected drive current improvement of 10–15%, based on simulations performed with a Medici device simulation program from Avanti. The double spacers for the p-channel devices provide larger spacer width, which constrains punch-through from the junction implant. Simultaneously, the n-channel devices in the CMOS structure are provided with the optimal polysilicon spacers, which prevent the loss of drive current associated with nitride spacers on n-channel devices. The polysilicon spacers allow lower dose n-channel LDD extension implant, and therefore is expected to improve Hot Carrier Injection (HCI) lifetime by approximately an order of magnitude for substrate currents for the n-channel devices, based on simulations performed with a Medici device simulation program from Avanti. The final inventive structure is illustrated in FIG. 2d, and is described hereinafter.

Figure 1:
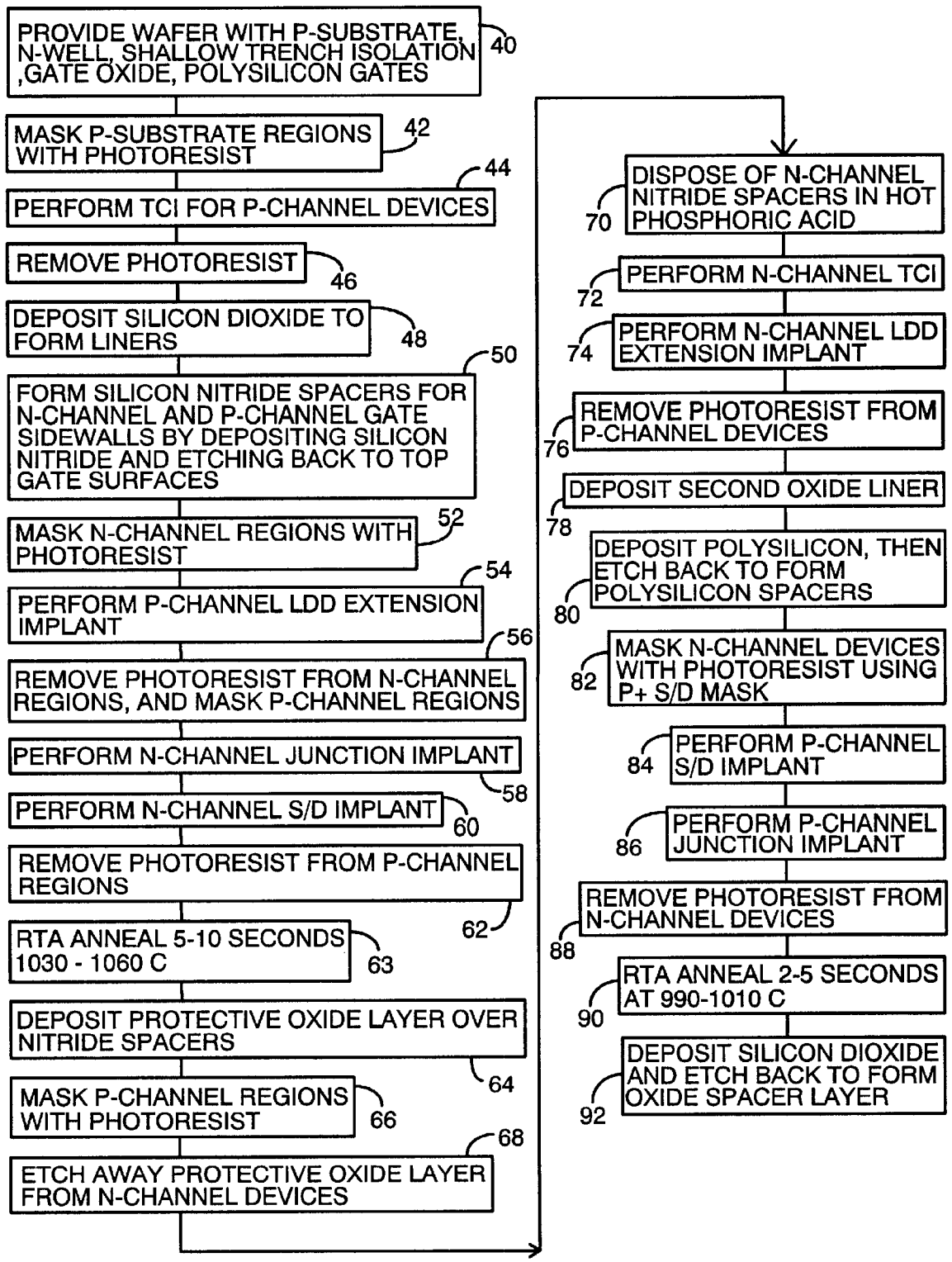
FIG. 1 is a flow chart describing process flow for the formation of the inventive structure.
Figure 2A:
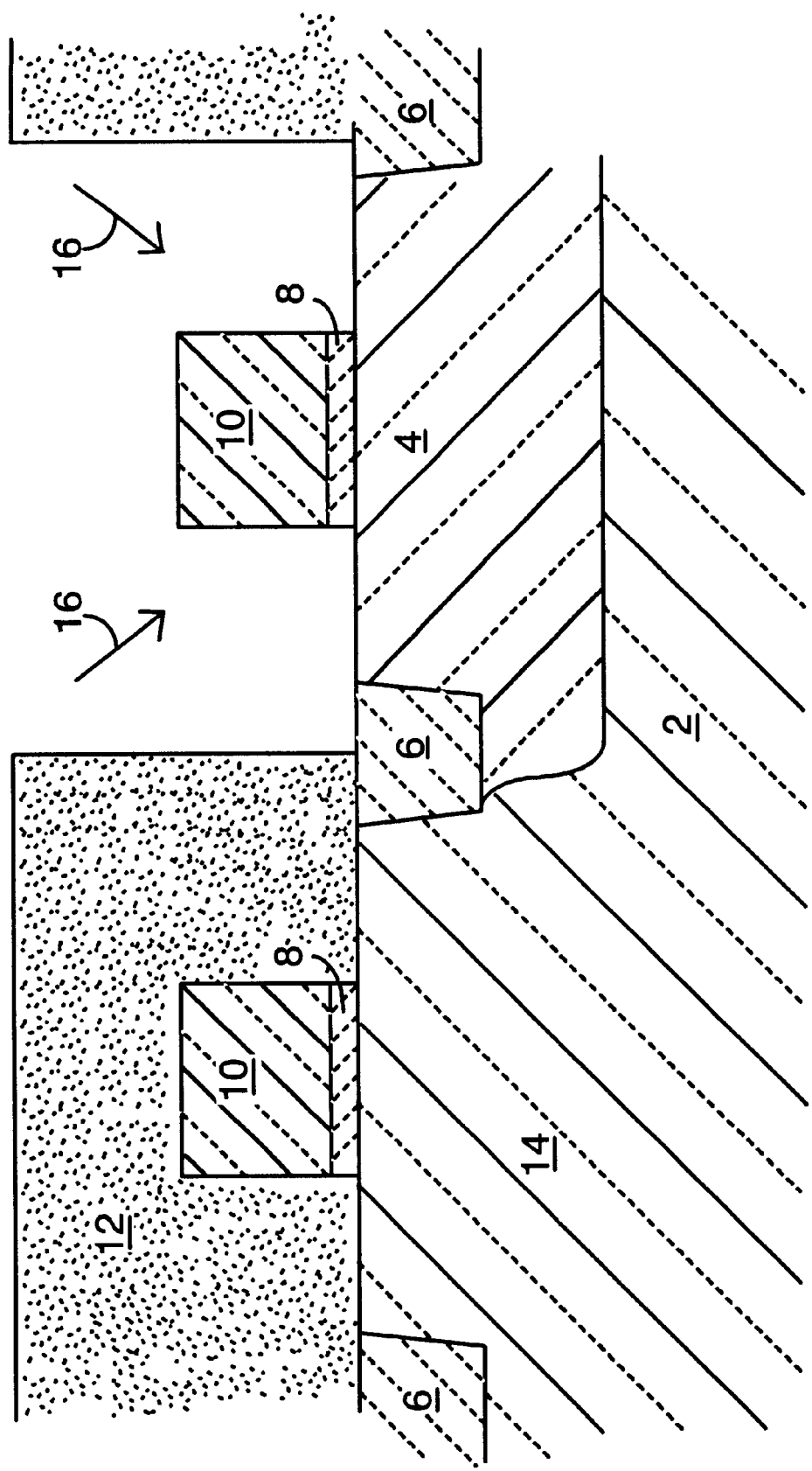
FIG. 2a is a cross-sectional diagram of a first intermediate structure in the formation of the inventive structure.
Figure 2B:
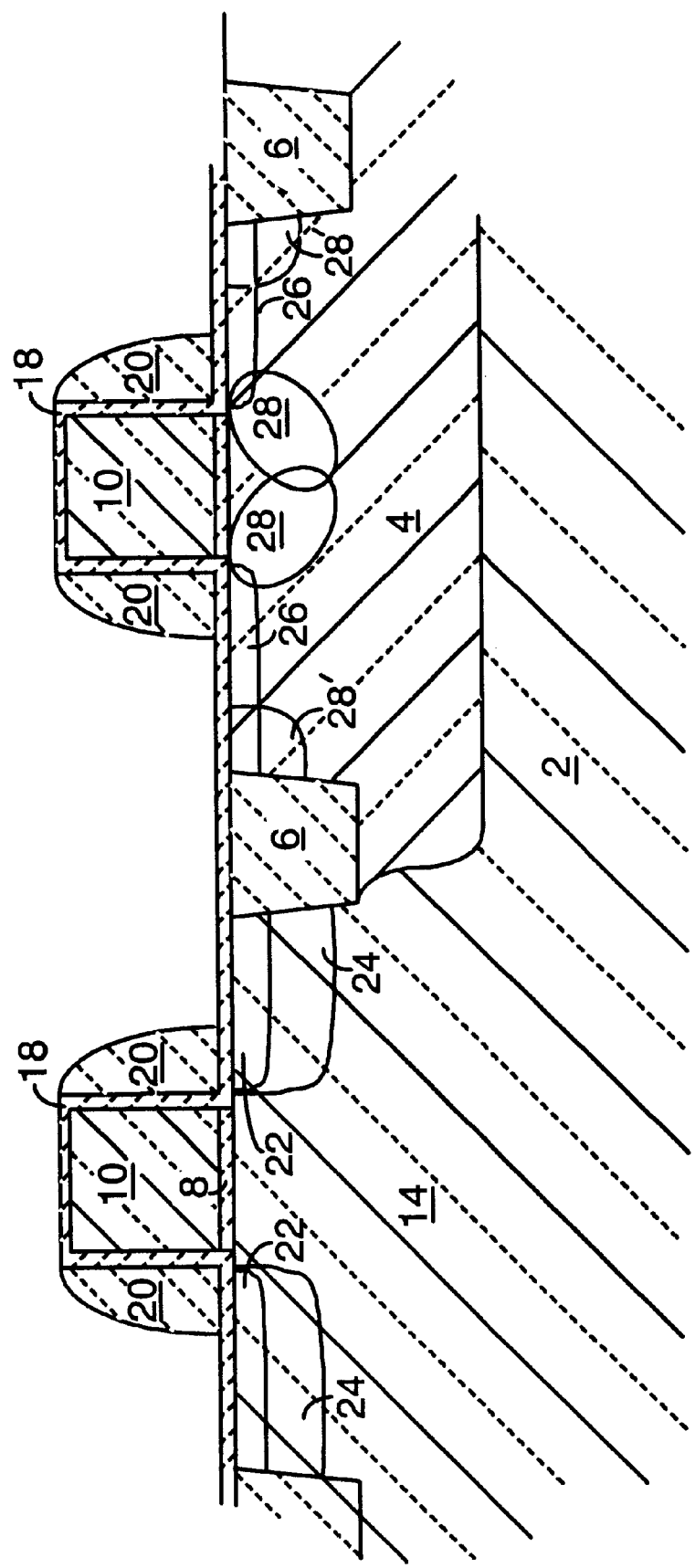
FIG. 2b is a cross-sectional diagram of a second intermediate structure in the formation of the inventive structure.
Figure 2C:
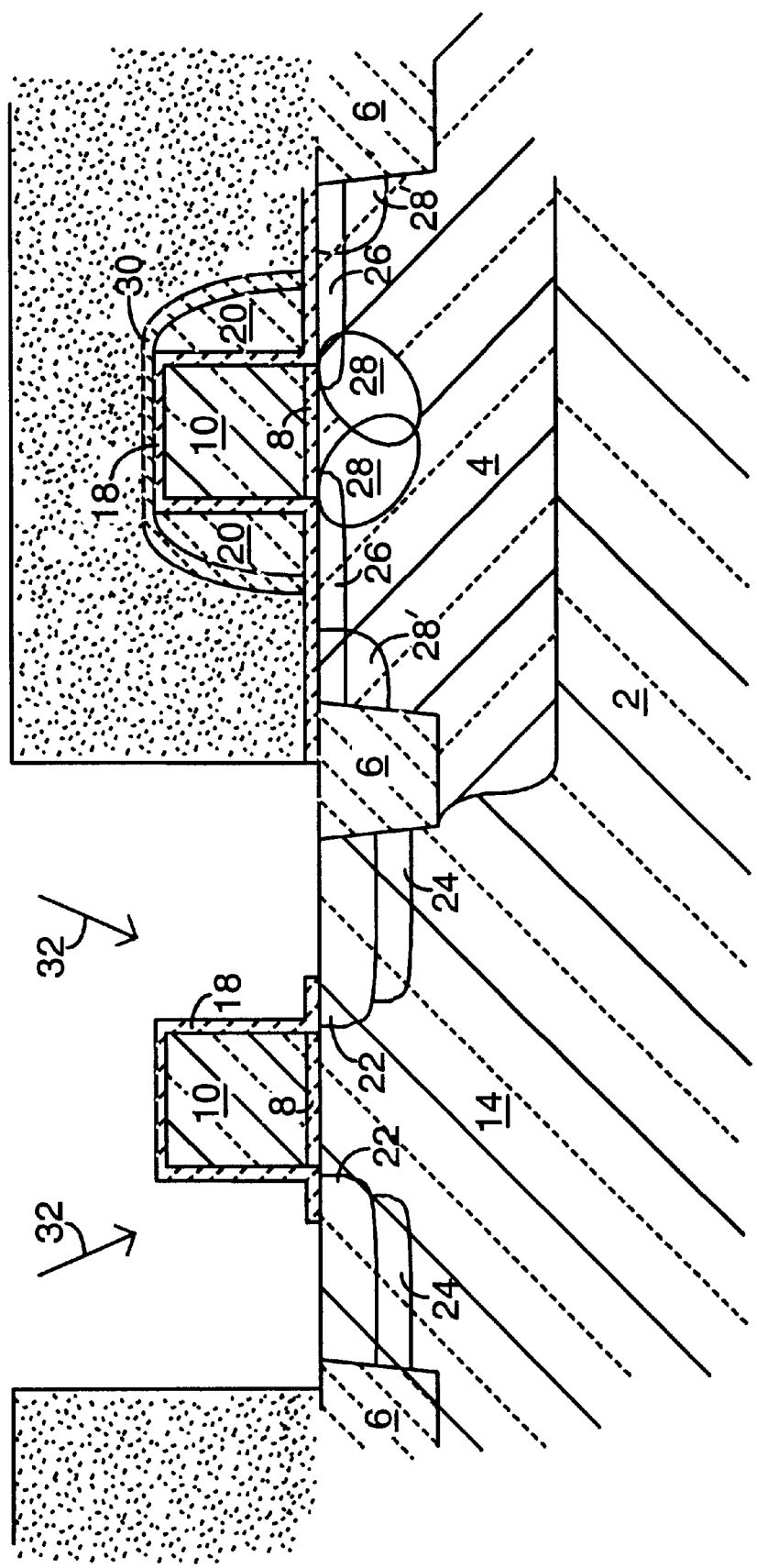
FIG. 2c is a cross-sectional diagram of a third intermediate structure in the formation of the inventive structure.
Figure 2D:
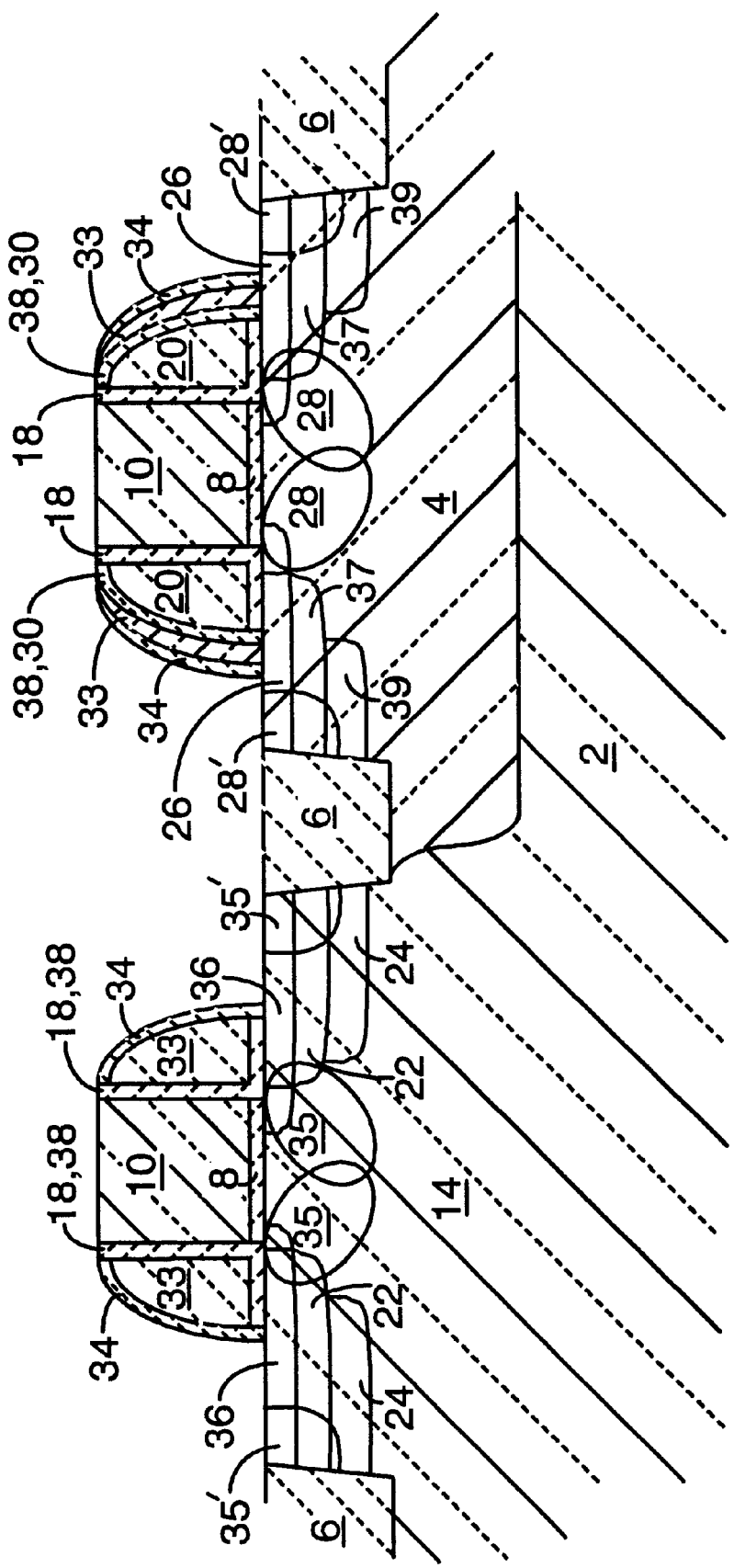
FIG. 2d is a cross-sectional diagram of the final inventive structure.

The inventive process, which results in the structure of FIG. 2d, is shown in flow chart form in FIG. 1. In step 40, a CMOS wafer 1 is provided with a p-substrate 2 with bulk doping of approximately $1\times10^{15}$ cm$^{-3}$, an n-well 4 with doping of approximately $5\times10^{16}$ cm$^{-3}$, shallow trench isolation 6 of 250–350 nm depth filled with an insulating material such as TEOS, gate oxide 8 comprised of 1.5–2.5 nm of thermally grown or nitrided oxide, and 100–175 nm thick doped polysilicon gates 10 with doping of approximately $1\times10^{20}$ cm$^{-3}$. In step 42, the p-substrate (i.e., n-channel) regions 14 are masked with photoresist 12. In step 44, a TCI 16 is performed for the p-channel devices, comprising phosphorus at 45–60 keV, total dose of 4–6e13 cm–2, tilt of 20–45° and 4 rotations. In step 46, photoresist 12 is removed. In step 48, 80–150 Å silicon dioxide is deposited to form oxide liners 18. In step 50, silicon nitride spacers 20 are formed for both n-channel and p-channel gate sidewalls, by depositing 500–700 Å nitride, then etching back to the top gate surfaces leaving nitride spacers. In step 52, the n-channel regions are masked. In step 54, p-channel LDD extension implant 26 is performed using BF2 at an energy of 3–9 keV, dose of 1e14–1e15 cm–2 and 0° tilt. In step 56, photoresist is removed from n-channel regions 14, and p-channel regions are masked. In step 58, n-channel junction implant 24 is performed using P at an energy of 30–50 keV, dose of 1e13–1e14 cm–2, and 0° tilt. In step 60, n-channel S/D implant 22 is performed using As at an energy of 15–30 keV, dose of 2–4e15 cm–2, and 0° tilt. The order of steps 58 and 60 is interchangeable. In step 62, photoresist is removed from p-channel regions. In step 63, RTA anneal is performed for 5–10 seconds at 1030–1060 C. In step 64, approximately 100–200 A oxide 30 is deposited over the nitride spacers 20. In step 66, the p-channel regions are masked with photoresist. In step 68, the oxide layer 30 of step 64 is etched away from the n-channel devices using a combination of Reactive Ion Etching (RIE) and wet etching. In step 70, the nitride spacers 20 on the n-channel device gates are disposed of in hot phosphoric acid. In step 72, n-channel TCI implant 32 is performed using BF2 at 40–60 keV energy, B at 10–15 keV energy, or In at 80–120 keV energy, any of the three possible ion types implanted at a dose of 3–6e13 cm-2, and at a tilt angle 31 of 20–45° with 4 rotations. In step 74, n-channel LDD extension implant 36 is performed using P at 3–5 keV energy, 1–10e14 cm-2 dose, and 0° tilt. The order of steps 72 and 74 is interchangeable. This LDD dose compares with doses approximately 30–40% higher when using oxide spacers in order to achieve the same drive current. In step 76, photoresist is removed from the p-channel devices. In step 78, 100 A silicon dioxide is deposited as a second liner 38. In step 80, 250–400 A polysilicon is deposited, then etched back to form polysilicon spacers 33 on n-channel and p-channel gate sidewalls (over the nitride spacers 20 for the p-channel devices). In step 82, n-channel devices are masked with photoresist using p+source/drain mask. In step 84, p-channel S/D implant 37 is performed using BF2 at 10–30 keV energy, 2–4 e15 cm-2 dose, and 0° tilt. In step 86, p-channel junction implant 39 is performed using B at 20–30 keV energy, 5e13–5e14 cm-2 dose, and 0° tilt. The order of steps 84 and 86 is interchangeable. In step 88, photoresist is removed from the n-channel devices. In step 90, RTA anneal is performed at 990–1010 C. for 2–5 seconds. In step 92 200–300 Angstroms silicon dioxide is deposited, then etched back to form a thin oxide spacer layer 34 which prevents subsequent silicidation of the poly spacers 33. The structure resultant from the performing of inventive steps 40–92 is shown in FIG. 2d. The wafer may then continue with standard CMOS processing including silicidation and metallization. The intermediate structures during the inventive process are shown in FIGS. 2a–2d.

FIG. 2a shows the structure following steps 40–44. Shown are p-substrate 2 having n-well 4 therein, shallow trench isolation regions 6, gate oxide 8, polysilicon gates 10, and having photoresist masking 12 over n-channel device region 14. TCI for p-channel devices is indicated by arrows 16, showing a tilt of 20–45 degrees.

FIG. 2b shows the structure following steps 46–62. Oxide liner 18 is shown, and nitride spacers 20 on the gates of both n-channel and p-channel devices. N-channel S/D implanted region 22, n-channel junction implanted region 24, p-channel LDD extension implanted region 26, and p-channel TCI region 28 including comer regions 28', are also shown.

FIG. 2c shows the structure following steps 64–70. Nitride spacers 20 have been disposed of for n-channel devices. Protective oxide layer 30 over p-channel nitride spacers 20 is shown. TCI for n-channel devices is indicated by arrows 32, showing a tilt of 20–45 degrees.

FIG. 2d shows the final inventive structure resulting after steps 72–94. Polysilicon spacers 33 are formed over n-channel and p-channel devices. Second oxide liner 38 separates nitride and poly spacers on p-channel devices. Oxide layer 34 protects poly spacers 33 during subsequent silicidation. N-channel TCI implanted region 35 including comer regions 35', n-channel LDD extension implanted region 36, p-channel S/D implanted region 37, and p-channel junction implanted region 39 are also shown.

By using the inventive structure and method for providing the structure, as described above, the spacers for p-channel and n-channel devices in a CMOS structure are separately chosen to optimize drive current in each type of device, and to improve HCI lifetimes for the n-channel devices.

It is not intended that the invention be restricted to the exact embodiments described herein. Process details such as exact temperatures, times, and doses may be modified without departing from the inventive concept. The spacer materials may also be varied, for example replacing silicon nitride with silicon oxynitride. The scope of the invention should be construed in view of the claims.

We claim:

1. In an integrated circuit CMOS structure on a silicon wafer substrate including a p-channel device in an n-type region of said substrate with a gate separated from said substrate by a gate dielectric, said gate having edge surfaces and a top surface, and further including an n-channel device in a p-type region of said substrate with a gate separated from said substrate by a gate dielectric, said gate having edge surfaces and a top surface, said n-channel device being separated from said p-channel device by an insulating region, the improvement comprising:

said edge surfaces of said gate of said p-channel device having p-channel device sidewall spacers thereon, said p-channel device sidewall spacers being comprised of a first spacer material;

said edge surfaces of said gate of said n-channel device having n-channel device sidewall spacers thereon, wherein said n-channel device sidewall spacers are comprised of a second spacer material and wherein said n-channel device sidewall spacers do not include said first spacer material;

wherein said first spacer material comprises silicon nitride, and said second spacer material comprises polysilicon.

2. The structure of claim 1, wherein said p-channel device includes:

a p-channel device source/drain (S/D) implanted region in an n-doped substrate region, said p-channel device S/D implanted region having a concentration of acceptor implanted dopants therein;

a p-channel device LDD extension implanted region in said n-doped substrate region, said p-channel device LDD extension implanted region having a concentration of acceptor implanted dopants therein;

a p-channel device channel implanted region in said n-doped substrate region, said p-channel device channel implanted region having a concentration of donor implanted dopants therein;

a p-channel device junction implanted region in said n-doped substrate region, said p-channel device junction implanted region having a concentration of acceptor implanted dopants therein; and wherein said n-channel device includes:

an n-channel device source/drain (S/D) implanted region in a p-doped substrate region, said n-channel device S/D implanted region having a concentration of donor implanted dopants therein;

an n-channel device LDD extension implanted region in said p-doped substrate region, said n-channel device LDD extension implanted region having a concentration of donor implanted dopants therein;

an n-channel device channel implanted region in said p-doped substrate region, said n-channel device channel implanted region having a concentration of acceptor implanted dopants therein; and an n-channel device junction implanted region in said p-doped substrate region, said n-channel device junction implanted region having a concentration of donor implanted dopants therein.

3. The structure of claim 2, wherein said first spacer material comprises silicon nitride and wherein said p-channel device sidewall spacers include a layer of polysilicon atop said silicon nitride.

4. The structure of claim 2, wherein said p-channel device channel implanted region and said n-channel device channel implanted regions are Tilted Channel Implant (TCI) regions.

5. The structure of claim 2, wherein:

said p-channel device S/D implanted region concentration of acceptor implanted dopants is in the range between 1 to $2\times10^{20}$ cm$^{-3}$;

said p-channel device LDD extension implanted region concentration of acceptor implanted dopants is in the range between 1 to $3\times10^{19}$ cm$^{-3}$;

said p-channel device channel implanted region concentration of donor implanted dopants is in the range between 1 to $3\times10^{18}$ cm$^{-3}$;

said p-channel device junction implanted region concentration of acceptor implanted dopants is in the range between 1 to $3\times10^{19}$ cm$^{-3}$;

said n-channel device S/D implanted region concentration of donor implanted dopants is in the range between 1 to $2\times10^{20}$ cm$^{-3}$;

said n-channel device LDD extension implanted region concentration of donor implanted dopants is in the range between 1 to $3\times10^{19}$ cm$^{-3}$;

said n-channel device channel implanted region concentration of acceptor implanted dopants is in the range between 1 to $3\times10^{18}$ cm$^{-3}$; and said n-channel device junction implanted region concentration of donor implanted dopants is in the range between 1 to $3\times10^{19}$ cm$^{-3}$.

6. The structure of claim 3, further including:

a first oxide layer contiguously on said gate edge surfaces of said n-channel device and said p-channel device;

a second oxide layer contiguously atop said nitride spacer on said p-channel device;

a third oxide layer contiguously atop said layer of polysilicon atop said silicon nitride spacer on said p-channel device and additionally being atop said polysilicon spacer on said n-channel device.

7. The structure of claim 6, wherein:

said p-channel device S/D implanted region concentration of acceptor implanted dopants is in the range between 1 to $2\times10^{20}$ cm$^{-3}$;

said p-channel device LDD extension implanted region concentration of acceptor implanted dopants is in the range between 1 to $3\times10^{19}$ cm$^{-3}$;

said p-channel device channel implanted region concentration of donor implanted dopants is in the range between 1 to $3\times10^{18}$ cm$^{-3}$;

said p-channel device junction implanted region concentration of acceptor implanted dopants is in the range between 1 to $3\times10^{19}$ cm$^{-3}$;

said n-channel device S/D implanted region concentration of donor implanted dopants is in the range between 1 to $2\times10^{20}$ cm$^{-3}$;

said n-channel device LDD extension implanted region concentration of donor implanted dopants is in the range between 1 to $3\times10^{19}$ cm$^{-3}$;

said n-channel device channel implanted region concentration of acceptor implanted dopants is in the range between 1 to $3\times10^{18}$ cm$^{-3}$;

said n-channel device junction implanted region concentration of donor implanted dopants is in the range between 1 to $3\times10^{19}$ cm$^{-3}$.

8. The structure of claim 7, formed by the method of:

providing said silicon wafer substrate, said substrate having an active n-channel device region with p-type bulk doping and an active p-channel device region with n-type bulk doping, said n-channel device region and said p-channel device region having an insulating region therebetween;

providing a first polysilicon gate having a top surface and edge surfaces atop said n-channel device region, a portion of said n-channel device region beneath said first polysilicon gate being an n-channel device channel region and a second polysilicon gate having a top surface and edge surfaces atop said p-channel device region, a portion of said p-channel device region beneath said second polysilicon gate being a p-channel device channel region, both said polysilicon gates being separated from said substrate by gate oxide layers;

masking said n-channel device region with photoresist;

implanting a p-channel Tilted Channel Implant (TCI) into said p-channel device channel region;

removing said photoresist;

depositing a first oxide liner layer onto said top gate surface and said gate edge surfaces of said first and second polysilicon gates;

depositing a silicon nitride layer;

etching back said silicon nitride layer until said first oxide layer on the top surfaces of said first and second polysilicon gates is exposed, silicon nitride spacers remaining on said edge surfaces of said first and second polysilicon gates;

masking said n-channel device region with photoresist;

implanting an LDD extension implant into said p-channel device region;

removing said photoresist;

masking said p-channel device region with photoresist;

implanting a junction implant into said n-channel device region;

implanting a Source/Drain (S/D) implant into said n-channel device region;

removing said photoresist;

performing a first anneal on said substrate;

depositing a protective oxide layer onto said silicon nitride spacers;

masking said p-channel device region with photoresist;

etching said protective oxide layer off said silicon nitride spacers on said first polysilicon gate;

disposing of said silicon nitride spacers on said first polysilicon gate;

implanting an n-channel TCI into said n-channel device channel region;

implanting an LDD extension implant into said n-channel device region;

removing said photoresist;

depositing a second oxide liner layer having a top surface;

depositing a polysilicon layer;

etching back said polysilicon layer until said top surface of said second oxide liner is exposed, polysilicon spacers remaining on said edge surfaces of said first polysilicon gate and atop said silicon nitride spacers on said edge surfaces of said second polysilicon gate;

masking said n-channel device region with photoresist;

implanting a S/D implant into said p-channel device region;

implanting a junction implant into said p-channel device region;

removing said photoresist;

performing a second anneal on said substrate;

depositing a third oxide layer over said polysilicon spacers; and etching back said third oxide layer until said top surfaces of said first and second polysilicon gates are exposed, a thin oxide spacer layer remaining atop said polysilicon spacers.

9. The structure of claim 11, wherein:

said p-channel TCI implantation step comprises implanting a dose of 4E13 to 6E13 cm$^{-2}$ of phosphorus at an energy of 45 to 60 keV, at a tilt angle of 20 to 45 degrees with 4 rotations;

said first oxide liner layer has a thickness of 80 to 150 Angstroms;

said silicon nitride layer has a thickness of 500 to 700 Angstroms;

said p-channel LDD extension implantation step comprises implanting a dose of 1E14 to 1E15 cm$^{-2}$ of BF$_2$ at an energy of 3 to 9 keV, at a tilt angle of 0 degrees;

said n-channel junction implantation step comprises implanting a dose of 1E13 to 1E14 cm$^{-2}$ of phosphorus at an energy of 30 to 50 keV, at a tilt angle of 0 degrees;

said n-channel S/D implantation step comprises implanting a dose 2E15 to 4E15 cm$^{-2}$ of arsenic at an energy of 15 to 30 keV, at a tilt angle of 0 degrees;

said first annealing step comprises annealing said substrate at 1030 to 1060 C. for 5 to 10 seconds;

said protective oxide layer has a thickness of 100 to 200 Angstroms; said step of disposing of said silicon nitride spacers comprises disposing of said silicon nitride spacers in hot phosphoric acid;

said n-channel TCI implantation step comprises implanting a dose of 3E13 to 6E13 cm$^{-2}$ of a material selected from the group consisting of BF$_2$ at 40 to 60 keV energy, B at 10 to 15 keV energy, and In at 80 to 120 keV energy, at a tilt angle of 20 to 45 degrees with 4 rotations;

said n-channel LDD extension implantation step comprises implanting a dose of 1E14 to 10E14 cm$^{-2}$ of phosphorus at 3 to 5 keV energy, at a tilt angle of 0 degrees;

said second oxide liner layer has a thickness of approximately 10 Angstroms;

said polysilicon layer has a thickness of 250 to 400 Angstroms;

said p-channel S/D implantation step comprises implanting a dose of 2E14 to 4E14 cm$^{-2}$ of BF$_2$ at an energy of 10 to 30 keV, at a tilt angle of 0 degrees;

said p-channel junction implantation step comprises implanting a dose of 5E13 to 5E14 of boron at an energy of 20 to 30 keV at a tilt angle of 0 degrees;

said second annealing step comprises annealing said substrate for 2 to 5 seconds at a temperature of 990 to 1010 C.; and said third oxide layer has a thickness of 200 to 300 Angstroms.

10. The structure of claim 1, wherein said p-channel device sidewall spacers are separated from said gate of said p-channel device by a first thin insulating layer, and said n-channel device sidewall spacers are separated from said gate of said n-channel device by a second thin insulating layer.

* * * * *